(12) United States Patent
Rofougaran et al.

(10) Patent No.: US 8,958,768 B2
(45) Date of Patent: *Feb. 17, 2015

(54) SYSTEM AND METHOD FOR RECEIVING I AND Q RF SIGNALS WITHOUT A PHASE SHIFTER

(71) Applicant: Broadcom Corporation, Irvine, CA (US)

(72) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/907,715

(22) Filed: May 31, 2013

(65) Prior Publication Data

US 2013/0259143 A1 Oct. 3, 2013

Related U.S. Application Data

(63) Continuation of application No. 12/650,277, filed on Dec. 30, 2009, now Pat. No. 8,457,581.

(60) Provisional application No. 61/246,618, filed on Sep. 29, 2009, provisional application No. 61/185,245, filed on Jun. 9, 2009.

(51) Int. Cl.
*H04B 1/06* (2006.01)
*H04B 7/00* (2006.01)
*G01S 13/06* (2006.01)
*H01Q 1/22* (2006.01)
*H01Q 13/22* (2006.01)
*H01Q 13/20* (2006.01)
*H04B 1/04* (2006.01)
*H04B 5/00* (2006.01)
*H04B 7/24* (2006.01)
*H01Q 15/00* (2006.01)

(52) U.S. Cl.
CPC .............. *G01S 13/06* (2013.01); *H01Q 1/2283* (2013.01); *H01Q 13/22* (2013.01); *H01Q 13/20* (2013.01); *H04B 1/04* (2013.01); *H04B 1/0458* (2013.01); *H04B 5/0031* (2013.01); *H04B 7/24* (2013.01); *H01Q 15/006* (2013.01)
USPC .......................... 455/269; 455/334; 343/702

(58) Field of Classification Search
USPC ........... 455/269, 323, 333, 334; 343/702, 770
See application file for complete search history.

(56) References Cited

U.S. PATENT DOCUMENTS

| | | | |
|---|---|---|---|
| 6,339,402 B1 * | 1/2002 | McKivergan | 343/702 |
| 6,404,390 B2 * | 6/2002 | Sheen | 343/700 MS |
| 8,457,581 B2 * | 6/2013 | Rofougaran et al. | 455/269 |
| 2005/0130700 A1 * | 6/2005 | Gardenfors et al. | 455/550.1 |

* cited by examiner

*Primary Examiner* — Nhan Le
(74) *Attorney, Agent, or Firm* — Oblon, Spivak, McClelland, Maier & Neustadt, L.L.P.

(57) ABSTRACT

Methods and systems for receiving in-phase and quadrature (I and Q) radio frequency (RF) signals without a phase shifter utilizing a leaky wave antenna are disclosed and may include generating in-phase and quadrature signals using a leaky wave antenna coupled to one or more low-noise amplifiers (LNAs) on a chip and without a phase shifter. The RF I and Q signals may be communicated from the single leaky wave antenna using coplanar feed points and/or feed points on a top surface and a bottom surface of the single leaky wave antenna. The leaky wave antennas may be integrated on the chip, on a package to which the chip is affixed, and/or on a printed circuit board to which the chip is affixed. The RF I and Q signals may be amplified by the one or more LNAs and may down-convert the RF I and Q signals to baseband signals.

21 Claims, 8 Drawing Sheets

SYSTEM AND METHOD FOR RECEIVING I AND Q RF SIGNALS WITHOUT A PHASE SHIFTER

This is a continuation of application Ser. No. 12/650,277 filed Dec. 30, 2009.

CROSS-REFERENCE TO RELATED APPLICATIONS/INCORPORATION BY REFERENCE

This application makes reference to and claims priority to U.S. Provisional Application Ser. No. 61/246,618 filed on Sep. 29, 2009, and U.S. Provisional Application Ser. No. 61/185,245 filed on Jun. 9, 2009.

This application makes reference:
U.S. patent application Ser. No. 12/650,212, filed on Dec. 30, 2009;
U.S. patent application Ser. No. 12/650,295, filed on Dec. 30, 2009;
U.S. patent application Ser. No. 12/650,192, filed on Dec. 30, 2009;
U.S. patent application Ser. No. 12/650,224, filed on Dec. 30, 2009;
U.S. patent application Ser. No. 12/650,176, filed on Dec. 30, 2009;
U.S. patent application Ser. No. 12/650,246, filed on Dec. 30, 2009;
U.S. patent application Ser. No. 12/650,292, filed on Dec. 30, 2009;
U.S. patent application Ser. No. 12/650,324, filed on Dec. 30, 2009.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for receiving I and Q RF signals without a phase shifter utilizing a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for receiving I and Q RF signals without a phase shifter utilizing a leaky wave antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for receiving I and Q RF signals without a phase shifter utilizing a leaky wave antenna. Exemplary aspects of the invention may comprise generating radio frequency (RF)

in-phase and quadrature (I and Q) signals using a single leaky wave antenna coupled to one or more low-noise amplifiers (LNAs) on a chip and without a phase shifter. The RF I and Q signals may be communicated from the single leaky wave antenna using coplanar feed points. The RF I and Q signals may be communicated from the single leaky wave antenna using feed points on a top surface and a bottom surface of the single leaky wave antenna. The one or more leaky wave antennas may be integrated on the chip, on a package to which the chip is affixed, and/or on a printed circuit board to which the chip is affixed. The RF I and Q signals may be amplified by the one or more low-noise amplifiers and may be down-converted to baseband signals or intermediate frequency (IF) signals. The baseband signals may be filtered.

Figure 1:
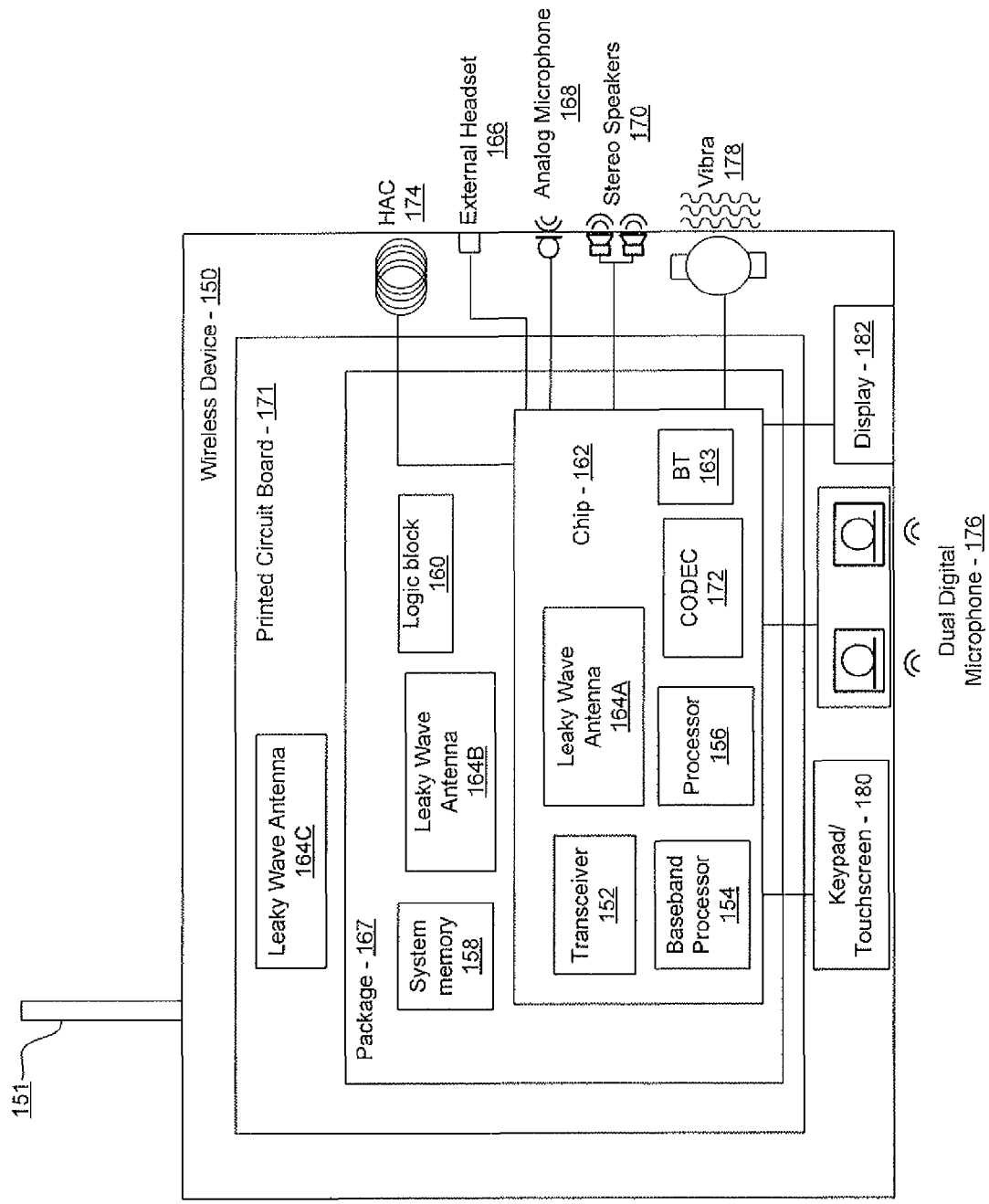
FIG. 1 is a block diagram of an exemplary wireless system utilizing leaky wave antennas for receiving I and Q signals, which may be utilized in accordance with an embodiment of the invention.

FIG. 1 is a block diagram of an exemplary wireless system utilizing leaky wave antennas for receiving I and Q signals, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A, 164B, and 164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, COMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The leaky wave antennas 164A and 164B may comprise a plurality of feed points. The reduced reflectivity surface may allow the resonant mode to "leak" out of or into the cavity. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of reception and/or the beam pattern received. In another embodiment of the invention, the leaky wave antenna 164B may be integrated on the package 167 and the leaky wave antenna 164C may be integrated in and/or on the printed circuit board 171 to which the chip 162 may be affixed. In this manner, the dimensions of the leaky wave antenna 164B and 164C may not be limited by the size of the chip 162. By configuring the feed points on the leaky wave antennas 164A, 164B, and 164C at an appropriate distance apart, resulting in a 90 degree phase difference, I and Q signals may be received without the use of phase shifters.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

Wireless signals may be transmitted and received by the leaky wave antennas 164A, 164B, and 164C. The receive beam pattern for the leaky wave antennas 164A, 164B, and 164C may be configured by adjusting the frequency of the signal communicated to the leaky wave antennas 164A, 164B, and 164C. Furthermore, the physical characteristics of the leaky wave antennas 164A, 164B, and 164C may be configured to adjust the bandwidth of the received signal.

In an embodiment of the invention, I and Q signals may be received by the leaky wave antennas 164A, 164B, and 164C utilizing the feed points spaced at a distance from each other laterally that result in received signals being 90 degrees out of phase. In another embodiment of the invention, the feed points may be placed at the top surface and the bottom surface, thereby resulting in 90 degree phase shift received at the feed points due to the λ/2 cavity height.

Figure 2:
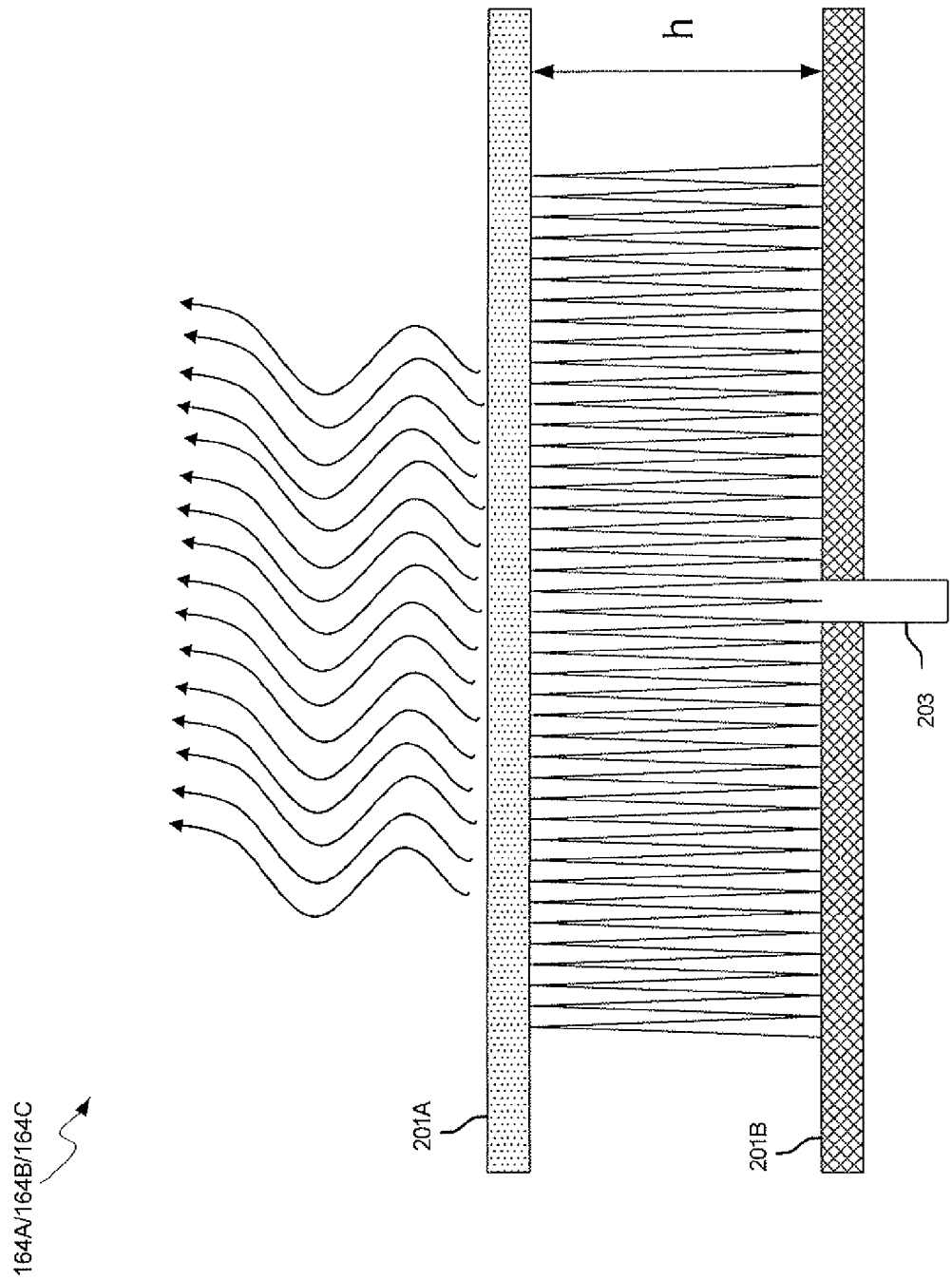
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antenna 164A/164B/164C/164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission and/or reception of the leaky wave antenna 164A/164B/164C/164C.

The feed point 203 may comprise a input terminal for applying an input voltage to and/or receiving an output voltage from the leaky wave antenna 164A/164B/164C/164C. The invention is not limited to a single feed point 203, as there may be any amount of feed points for different phases of signal, for example, to be applied to or received from the leaky wave antenna 164A/164B/164C/164C.

In an embodiment of the invention, the height, h, may be one-half the wavelength of the transmitted mode from the leaky wave antenna 164A/164B/164C. In this manner, the phase of an electromagnetic mode that traverses the cavity twice may be coherent with the signal received at the partially reflective surface 201A, thereby configuring a resonant cavity known as a Fabry-Perot cavity. The magnitude of the resonant mode may decay exponentially in the lateral direction from region under the features in the partially reflective surface, shown in FIG. 3, thereby reducing or eliminating the need for confinement structures to the sides of the leaky wave antenna 164A/164B/164C. The output impedance of the leaky wave antenna 164A/164B/164C may be configured by the vertical placement of the feed point 203, as described further in FIG. 6.

In operation, an RF signal may be received by the leaky wave antenna 164A/164B/164C. The cavity height, h, may be configured to correlate to one half the wavelength of the signal of frequency f. The signal may traverse the height of the cavity and may be reflected by the reflective surface 201B, and then traverse the height back to the partially reflective surface 201A. Since the wave will have traveled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antenna 164A/164B/164C may be integrated on or in a chip, package, or printed circuit board. The leaky wave antenna 164A/164B/164C may comprise receive antenna for I and Q signals. The output impedance of the leaky wave antenna 164A/164B/164C may be configured to match the input impedance of devices coupled to the feed points. In this manner, matching circuit requirements may be reduced or eliminated.

The beam shape of the received signal may comprise a narrow vertical beam when the frequency of the signal received at the partially reflective surface 201A matches the resonant frequency of the cavity. In instances where the frequency shifts from the center frequency, the received signal beam shape may become conical, with nodes at an angle from vertical. This is described further with respect to FIGS. 4 and 5.

In an embodiment of the invention, I and Q signals may be received by the leaky wave antennas 164A, 164B, and 164C utilizing feed points spaced at a distance from each other laterally that result in received signals being 90 degrees out of phase. In another embodiment of the invention, feed points may be placed at the top surface and the bottom surface, thereby resulting in 90 degree phase shift received at the feed points due to the λ/2 cavity height.

Figure 3:
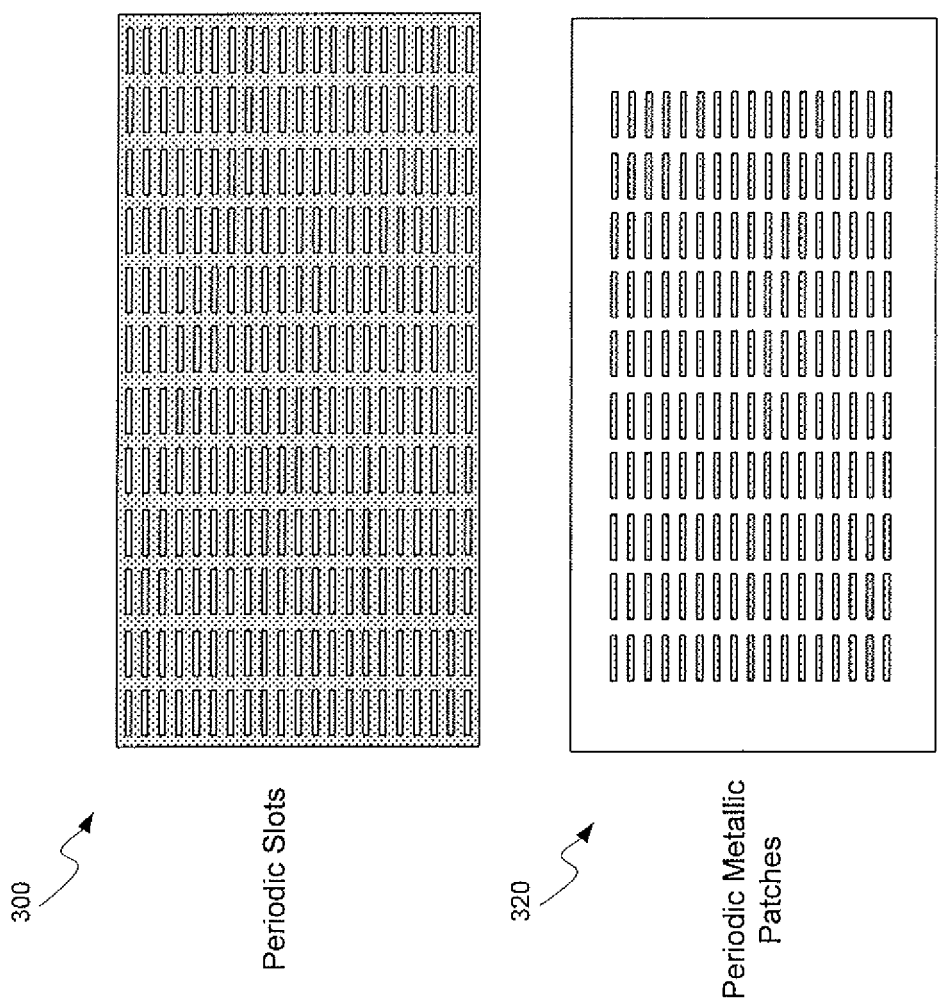
FIG. 3 is a block diagram illustrating a plan view of exemplary partially reflective surfaces, in accordance with an embodiment of the invention.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via micro-electromechanical system (MEMS) switches to tune the Q of the resonant cavity.

Figure 4:
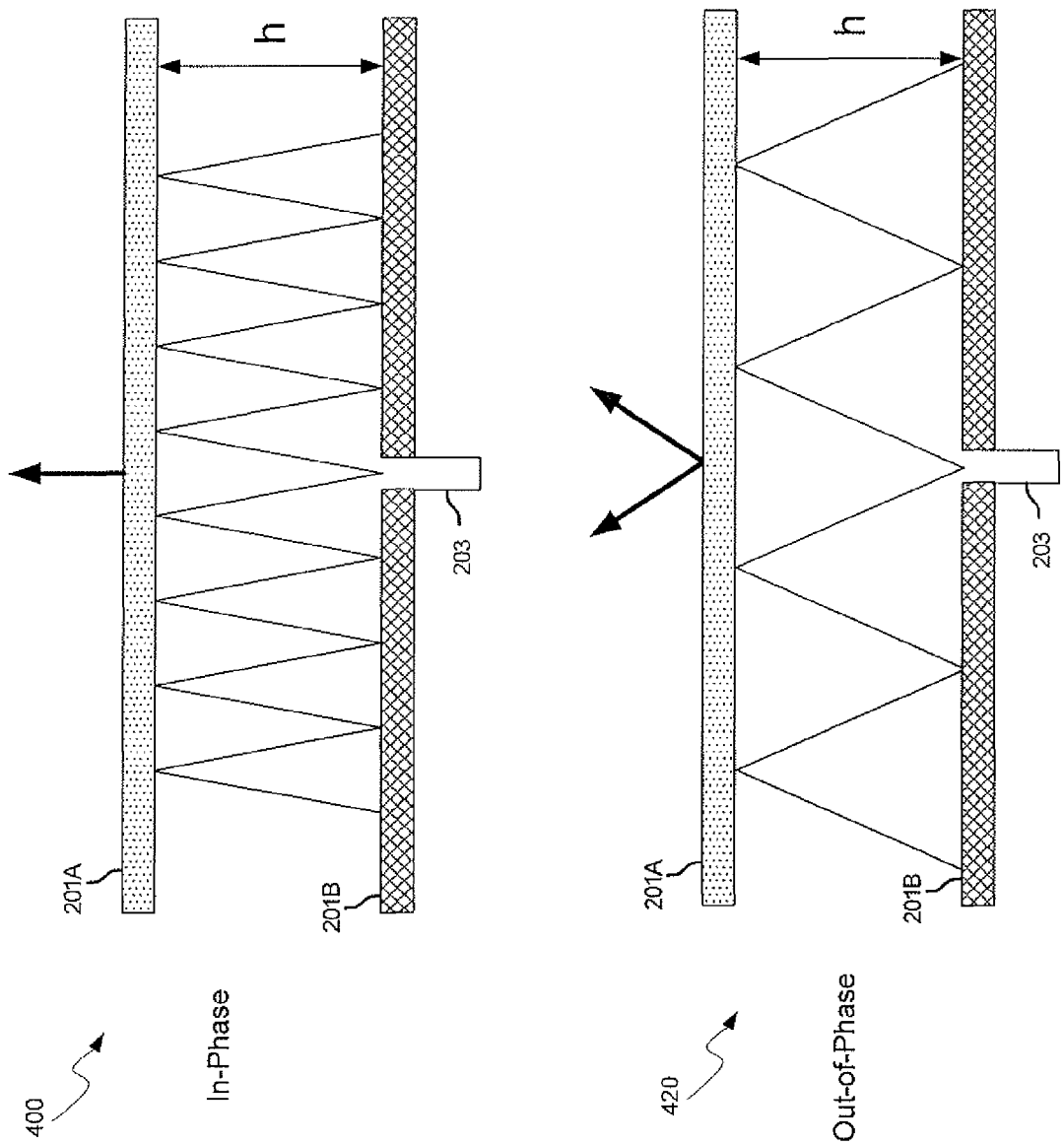
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partial reflective surface 201A, the reflective surface 201B, and the feed point 203. In-phase condition 400 illustrates the relative beam shape transmitted and/or received by the leaky wave antenna 164A/164B/164C when the frequency of the signal received matches that of the resonant cavity as defined by the cavity height, h, and the dielectric constant of the material between the reflective surfaces.

Similarly, out-of-phase condition 420 illustrates the relative beam shape transmitted and/or received by the leaky wave antenna 164A/164B/164C when the frequency of the signal received at the partially reflective surface 201A does not match that of the resonant cavity. The resulting beam shape may be conical, as opposed to a single main vertical node. These are illustrated further with respect to FIG. 5.

Figure 5:
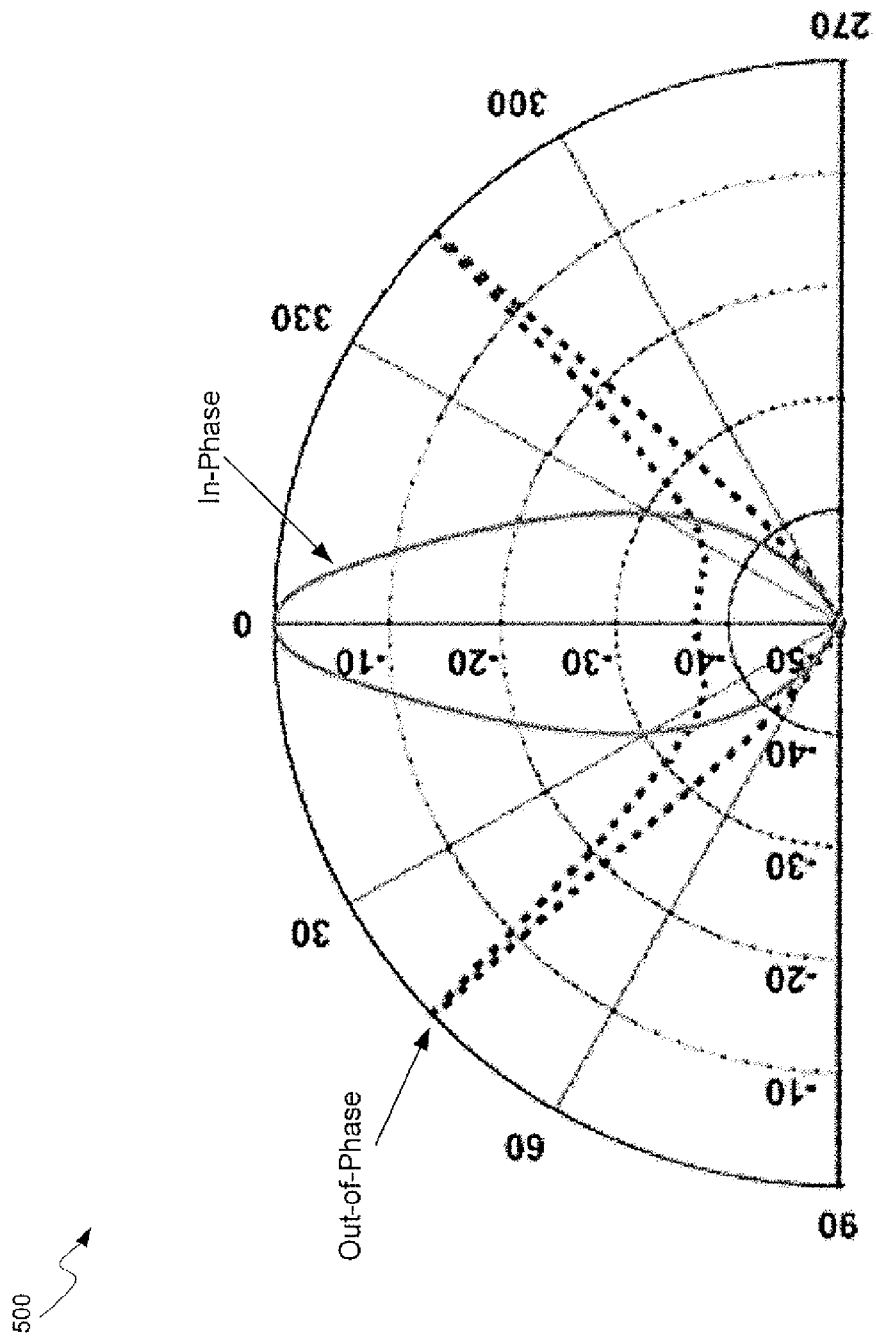
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted/received signal beam shape versus angle for the in-phase and out-of-phase conditions for a leaky wave antenna.

The in-phase curve in the plot 500 may correlate to the case where the frequency of the signal communicated to a leaky wave antenna matches the resonant frequency of the cavity. In this manner, a single vertical main node may result. In instances where the frequency of the signal received is not at the resonant frequency, a double, or conical-shaped node may be generated as shown by the Out-of-phase curve in the plot 500.

Figure 6:
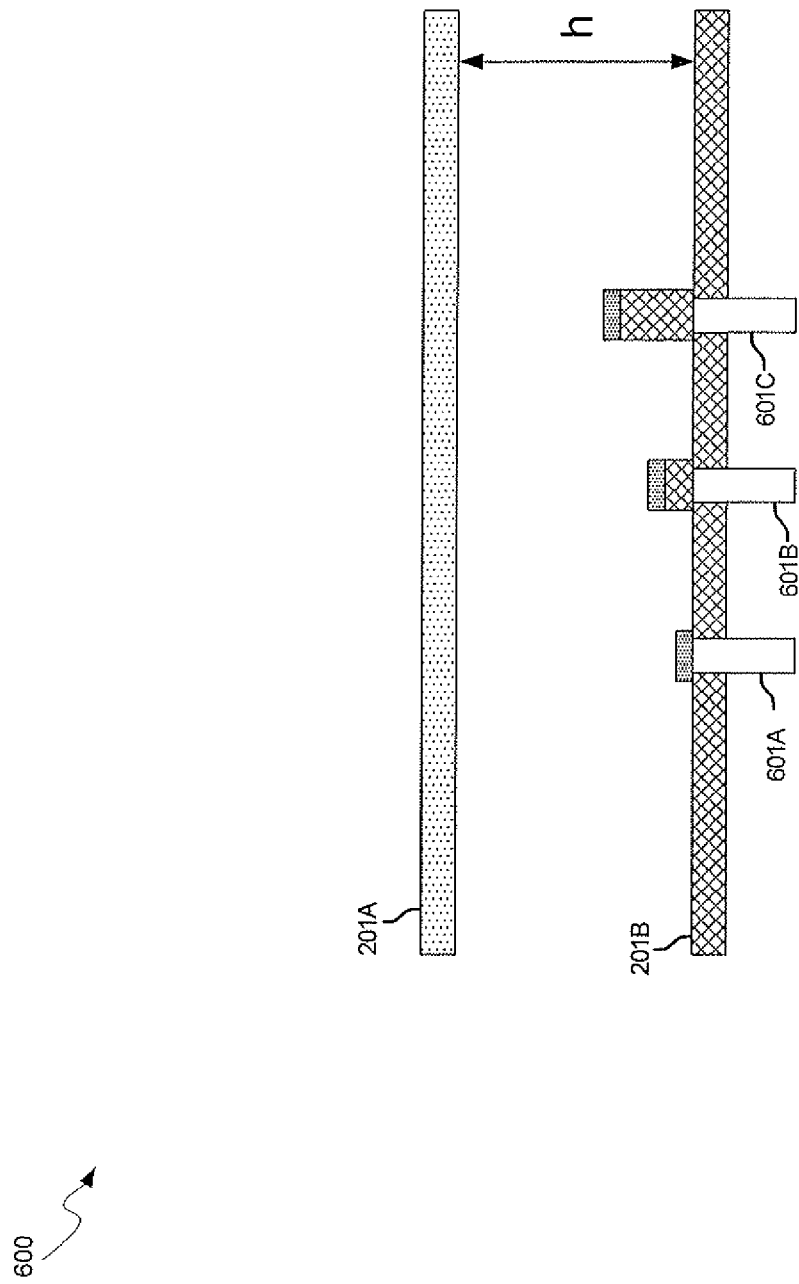
FIG. 6 is a block diagram illustrating a leaky wave antenna with variable phase feed points, in accordance with an embodiment of the invention.

FIG. 6 is a block diagram illustrating a leaky wave antenna with variable phase feed points, in accordance with an embodiment of the invention. Referring to FIG. 6, there is shown a leaky wave antenna 600 comprising the partially reflective surface 201A and the reflective surface 201B. There is also shown feed points 601A-601D. The feed points 601A-601D may be located at different positions along the bottom surface of the cavity and on the top of the cavity thereby configuring different phase points for the leaky wave antenna.

For example, the feed points 601A and 601B may be separated by a distance that results in a 90 degree phase shift between received signals. Similarly, the feed points 601C and 601D may be separated by a 90 degree phase difference due to the $\lambda/2$ cavity height h. In this manner, a leaky wave antenna may be operable to receive I and Q signals without the need for a phase shifter. In various embodiments of the invention, the feed points may be separated by different positions so as to provide a plurality of different phases and phase differences.

Figure 7:
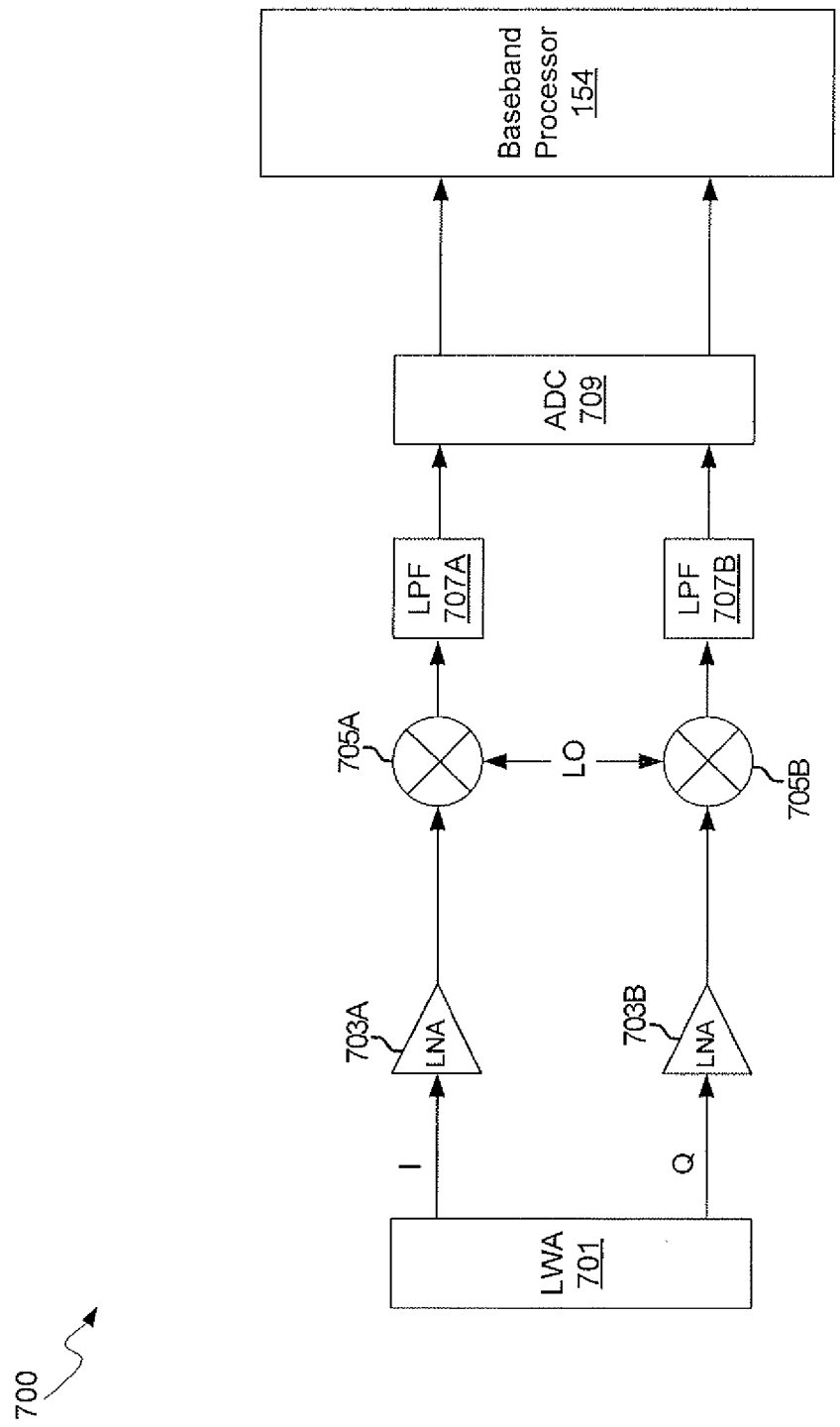
FIG. 7 is a block diagram of an I and Q receiver utilizing a leaky wave antenna, in accordance with an embodiment of the invention.

FIG. 7 is a block diagram of an I and Q receiver utilizing a leaky wave antenna, in accordance with an embodiment of the invention. Referring to FIG. 7, there is shown an I and Q receiver (Rx) 700 comprising a leaky wave antenna 701, low-noise amplifiers (LNAs) 703A and 703B, mixers 705A and 705B, low-pass filters (LPFs) 707A and 707B, an analog to digital converter (ADC) 709, and the baseband processor 154.

The leaky wave antenna 701 may be substantially similar to leaky wave antennas 164A/164B/164C/600. The LNAs 703A and 703B may comprise suitable circuitry, logic, interfaces, and/or code that may be operable to amplify received signals. Specifically, the LNAs 703A and 703B may amplify received I and Q signals to be communicated to the mixers 705A and 705B.

The mixers 705A and 705B may comprise suitable circuitry, logic, interfaces, and/or code that may be operable to down-convert received I and Q signals to baseband or intermediate frequency (IF). The mixers 705A and 705B may utilize a received local oscillator (LO) signal, such as from a voltage-controlled oscillator (VCO) or other source, to down-convert the received I and Q signals, thereby generating sum and difference signals.

The LPFs 707A and 707B may comprise suitable circuitry, logic, interfaces, and/or code that may be operable to filter out higher frequency signals while allowing lower frequency signals to pass. The outputs of the LPFs 707A and 707B may be communicatively coupled to the ADC 709.

The ADC 709 may comprise suitable circuitry, logic, interfaces, and/or code that may be operable to convert received analog signals to digital signals for processing by the baseband processor 154. The ADC 709 may be operable to receive more than two signals for conversion.

In operation, the leaky wave antenna 701 may be operable to receive both and Q signals without the need for a phase shifter. The I and Q signals may be communicated to the LNAs 703A and 703B, which may amplify the received signals before communicating the amplified signals to the mixers 705A and 705B. The gain of the LNAs 703A and 703B may be configured by the baseband processor 154 or the processor 156, depending on the strength of the received signals.

The mixers 705A and 7053 may down-convert the amplified I and Q signals utilizing the LO signal, thereby generating sum and difference signals that may be communicated to the LPFs 707A and 707B. In this manner, the sum signals generated by the mixers 705A and 705B may be filtered out while the difference, or baseband, signals may be communicated to the ADC 709.

The ADC 709 may convert the filtered I and Q signals to digital signals and communicate these converted signals to the baseband processor 154 for further processing.

Figure 8:
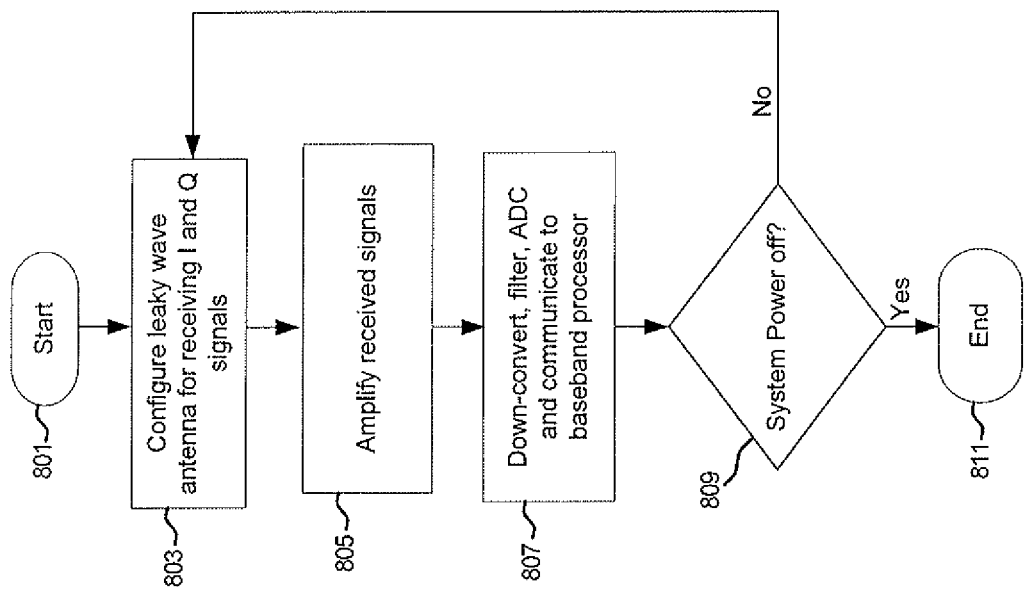
FIG. 8 is a block diagram illustrating exemplary steps for receiving I and Q signals without a phase shifter, in accordance with an embodiment of the invention.

FIG. 8 is a block diagram illustrating exemplary steps for receiving I and Q signals without a phase shifter, in accordance with an embodiment of the invention. Referring to FIG. 8, in step 803 after start step 801, the leaky wave antenna may be configured to receive I and Q signals through feed points with 90 degree phase points. In step 805, the received signals may be amplified by LNAs, followed by step 807 where the amplified I and Q signals may be down-converted to baseband, filtered, and analog-to-digital converted before being communicated to the baseband processor. If, in step 809, the wireless device 150 is to be powered down, the exemplary steps may proceed to end step 811. In instances when the wireless device 150 is not to be powered down, the exemplary steps may proceed back to step 803 where the I and Q signals are received via the leaky wave antenna.

In an embodiment of the invention, a method and system are disclosed for generating radio frequency (RF) in-phase and quadrature (I and Q) signals using a single leaky wave antenna 164A/164B/164C/600 coupled to one or more low-noise amplifiers (LNAs) 703A/703B on a chip 162 and without a phase shifter. The RF I and Q signals may be communicated from the single leaky wave antenna 164A/164B/164C/600 using coplanar feed points 601A/601B. The RF I and Q signals may be communicated from the single leaky wave antenna 164A/164B/164C/600 using feed points 601C/601D on a top surface 201A and a bottom surface 201B of the single leaky wave antenna 164A/164B/164C/600. The one or more leaky wave antennas 164A/164B/164C/600 may be integrated on the chip 162, on a package 167 to which the chip 162 is affixed, and/or on a printed circuit board 171 to which the chip 162 is affixed. The RF I and Q signals may be amplified by the one or more low-noise amplifiers 703A/703B and may be down-converted the RF I and Q signals to baseband signals or intermediate frequency (IF) signals. The baseband signals may be filtered.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for receiving I and Q RF signals without a phase shifter utilizing a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A communications system comprising:
   a circuit coupled to a leaky wave antenna, wherein said circuit is operable to receive a radio frequency (RF) signal from said leaky wave antenna, and
   said circuit is operable to generate, from said RF signal, using said leaky wave antenna including at least two feed points, and without using a phase shifter, an in-phase RF signal and a quadrature RF signal.

2. The communications system of claim 1, wherein said circuit comprises a low-noise amplifier.

3. The communications system of claim 2, wherein said circuit is operable to amplify said in-phase RF signal and said quadrature RF signal with said low-noise amplifier.

4. The communications system of claim 1, wherein said circuit comprises a low-noise amplifier and is integrated in a chip in said system.

5. The communications system of claim 4, wherein said leaky wave antenna is integrated on said chip.

6. The communications system of claim 4, wherein said leaky wave antenna is integrated on a package to which said chip is affixed.

7. The communications system of claim 4, wherein said leaky wave antenna is integrated on a printed circuit board to which said chip is affixed.

8. The communications system of claim 4, wherein said circuit is operable to amplify said in-phase RF signal and said quadrature RF signal with said low-noise amplifier.

9. The communications system of claim 1, wherein said circuit is operable to communicate said in-phase RF signal and said quadrature RF signal from said leaky wave antenna using coplanar feed points.

10. The communications system of claim 1, wherein said circuit is operable to communicate said in-phase RF signal and said quadrature RF signal using feed points on a top surface and a bottom surface of said single leaky wave antenna.

11. The communications system of claim 1, wherein said circuit is operable to down-convert said in-phase RF signal and said quadrature RF signal to baseband signals.

12. The communications system of claim 11, wherein said circuit is operable to filter said baseband signals.

13. The communications system of claim 1, wherein said circuit is operable to down-convert said in-phase RF signal and said quadrature RF signal to intermediate frequency (IF) signals.

14. The communications system of claim 13, wherein said circuit is operable to filter said IF signals.

15. The communications system of claim 1, wherein said communications system is configured to interface with a wireless standard selected from the group consisting of GSM, CDMA, CDMA2000, WCDMA, GPRS, EDGE, WIMAX, BLUETOOTH, and ZIGBEE.

16. The communications system of claim 1, wherein the at least two feed points are positioned at a predetermined distance from each other, the predetermined distance corresponding to a 90 degree phase shift between the in-phase RF signal and the quadrature RF signal.

17. A method for communication, said method comprising:
   receiving a radio frequency (RF) signal from a leaky wave antenna; and
   generating, from said RF signal, using said leaky wave antenna including at least two feed points, and without using a phase shifter, an in-phase RF signal and a quadrature RF signal.

18. The method of claim 17, wherein said wireless device comprises a low-noise amplifier.

19. The method of claim 17, wherein said wireless device is operable to communicate said in-phase RF signal and said quadrature RF signal from said leaky wave antenna using coplanar feed points.

20. The method of claim 17, wherein said wireless device is operable to communicate said in-phase RF signal and said quadrature RF signal using feed points on a top surface and a bottom surface of said single leaky wave antenna.

21. The method of claim 17, wherein said leaky wave antenna is integrated within said wireless device.

* * * * *